United States Patent
Li et al.

(10) Patent No.: US 10,290,626 B1
(45) Date of Patent: May 14, 2019

(54) HIGH VOLTAGE ELECTROSTATIC DISCHARGE (ESD) BIPOLAR INTEGRATED IN A VERTICAL FIELD-EFFECT TRANSISTOR (VFET) TECHNOLOGY AND METHOD FOR PRODUCING THE SAME

(71) Applicant: GLOBALFOUNDRIES Inc., Grand Cayman (KY)

(72) Inventors: You Li, South Burlington, VT (US); Alain Loiseau, Williston, VT (US); Tsung-Che Tsai, Essex Junction, VT (US); Mickey Yu, Essex Junction, VT (US); Souvick Mitra, Essex Junction, VT (US); Robert Gauthier, Jr., Williston, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/870,238

(22) Filed: Jan. 12, 2018

(51) Int. Cl.
*H01L 27/02* (2006.01)
*H01L 21/8238* (2006.01)
(Continued)

(52) U.S. Cl.
CPC .... *H01L 27/0259* (2013.01); *H01L 21/28518* (2013.01); *H01L 21/823814* (2013.01); *H01L 21/823828* (2013.01); *H01L 21/823871* (2013.01); *H01L 21/823885* (2013.01); *H01L 21/823892* (2013.01); *H01L 23/535* (2013.01); *H01L 27/0922* (2013.01);
(Continued)

(58) Field of Classification Search
CPC ............. H01L 27/0259; H01L 27/0922; H01L 29/0847; H01L 29/1083; H01L 29/7827; H01L 21/823871; H01L 23/535; H01L 21/823828; H01L 21/823814; H01L 21/823892; H01L 21/823885; H01L 21/28518
USPC ........................................................ 257/328
See application file for complete search history.

(56) References Cited

U.S. PATENT DOCUMENTS

2012/0001233 A1\* 1/2012 Lee ................... H01L 27/11526
257/208

OTHER PUBLICATIONS

Renaud et al. "High robustness PNP-based structure for the ESD protection of high voltage I/Os in an advanced smart power technology", published in Bipolar/BiCMOS Circuits and Technology Meeting, BCTM 2007, IEEE, pp. 226-229.
(Continued)

*Primary Examiner* — Fernando L Toledo
*Assistant Examiner* — Adam S Bowen
(74) *Attorney, Agent, or Firm* — Ditthavong & Steiner, P.C.

(57) ABSTRACT

Methods of integrating a HV ESD PNP bipolar transistor in a VFET process and the resulting devices are provided. Embodiments include forming a DNW region in a portion of a p-sub; forming a HVPDDD region in a portion of the DNW region; forming a first and a second NW in a portion of the DNW region, the second NW between the first NW and the HVPDDD region and laterally separated from the HVPDDD region; forming a PW in a portion of the HVPDDD region; forming an N+ implant in a portion of the first NW and a P+ implant in a portion of the PW; forming a first, a second and a third fin structures over the first and the second NW and the PW, respectively; and forming a N+ S/D, a P+ S/D and a P+ S/D over the first, the second and the third fin structures, respectively.

18 Claims, 5 Drawing Sheets

(51) Int. Cl.
*H01L 27/092* (2006.01)
*H01L 21/285* (2006.01)
*H01L 29/78* (2006.01)
*H01L 29/10* (2006.01)
*H01L 29/08* (2006.01)
*H01L 23/535* (2006.01)

(52) U.S. Cl.
CPC ...... *H01L 29/0847* (2013.01); *H01L 29/1083* (2013.01); *H01L 29/7827* (2013.01)

(56) References Cited

OTHER PUBLICATIONS

Vashchenko et al., "Lateral PNP BJT ESD Protection Devices", published in Bipolar/BiCMOS Circuits and Technology Meeting, BCTM 2008, IEEE, pp. 53-56.
Liu et al., "Tunable Low-Voltage Dual-Directional ESD Protection for RFICs", published in Radio and Wireless Symposium (RWS), 2011, IEEE, pp. 279-282.

\* cited by examiner

US 10,290,626 B1

HIGH VOLTAGE ELECTROSTATIC DISCHARGE (ESD) BIPOLAR INTEGRATED IN A VERTICAL FIELD-EFFECT TRANSISTOR (VFET) TECHNOLOGY AND METHOD FOR PRODUCING THE SAME

TECHNICAL FIELD

The present disclosure relates to electrostatic discharge (ESD) protection devices. The present disclosure is particularly applicable to a vertical field-effect transistor (VFET).

BACKGROUND

As integrated circuits (ICs) continue to decrease in size as a consequence of market demand, fin field-effect transistors (finFETs) are used extensively for their relatively higher drive current and ability to prevent short-channel effects. However, use of finFETs in smaller technology has led to an increased susceptibility of failure for finFETs from ESD because of their relatively small channel width. For the ESD protection, the current shunting capabilities of finFETs are limited by the constraints of on-chip area. The smaller channel width leads to an increased current density during an ESD event resulting in breakdown of the dielectric gate oxide between the active area and the gate. As a result, finFETs may experience complete failure because the breakdown may result in a short between the gate and the active area. Further, an increasing number of specific applications such as in the automotive field need high voltage (HV) devices. However, HV devices are difficult to build on finFET or VFET technology.

A need therefore exists for methodology enabling forming HV ESD structures in a VFET process to address the scaling and design challenges of ESD protection in deeply scaled technologies.

SUMMARY

An aspect of the present disclosure is a method of integrating HV ESD p-type; n-type; p-type (PNP) bipolar transistor in a VFET process.

An aspect of the present disclosure is a method of integrating HV ESD n-type; p-type; n-type (NPN) bipolar transistor in a VFET process.

Another aspect of the present disclosure is a device including an integrated HV ESD PNP bipolar transistor and VFET.

Another aspect of the present disclosure is a device including an integrated HV ESD NPN bipolar transistor and VFET.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming an n-doped well (DNW) region in a portion of a p-type substrate (p-sub); forming a p-type high voltage double diffusion drain (HVPDDD) region in a portion of the DNW region; forming a first n-well (NW) and a second NW in a portion of the DNW region, the second NW between the first NW and the HVPDDD region and laterally separated from the HVPDDD region; forming a p-well (PW) in a portion of the HVPDDD region; forming an n-type (N+) implant in a portion of the first NW and a p-type (P+) implant in a portion of the PW; forming a first fin structure, a second fin structure and a third fin structure over the first NW, the second NW and the PW, respectively; and forming a N+ source/drain (S/D), a P+ S/D and a P+ S/D over the first fin structure, the second fin structure and the third fin structure, respectively.

Aspects of the present disclosure include forming a gate all around (GAA) around each of the first fin structure, the second fin structure and the third fin structure. Further aspects include forming a pair of dummy fins, laterally separated, over the DNW region between the second NW and the HVPDDD region. Another aspect includes forming a second P+ implant in a portion of the second NW; and forming a first contact structure, a second contact structure and a third contact structure over the N+ implant, the first P+ implant and the second P+ implant, respectively, wherein the N+ implant, the first P+ implant and the second P+ implant are a base, an emitter and a collector, respectively, and the first contact structure, the second contact structure and the third contact structure are a base contact, an emitter contact and a collector contact, respectively. Additional aspects include forming a first contact structure and a second contact structure over the N+ implant and the P+ implant, respectively, wherein the N+ implant, the second fin structure and the P+ implant are a base, an emitter and a collector, respectively, and the first contact structure and the second contact structure are a base contact and a collector contact, respectively. Further aspects include forming the GAA around the second fin structure and the third fin structure with an L-shaped portion facing each other. Additional aspects include forming a silicide block (SBLK) layer over the L-shaped portions and the P-sub in between. Further aspects include forming a first contact structure and a second contact structure over the N+ implant and the P+ implant, respectively, wherein the N+ implant, the second fin structure and the P+ implant are a base, a collector and an emitter, respectively, and the first contact structure and the second contact structure are a base contact and an emitter contact, respectively. Additional aspects include forming the N+ S/D, the P+ S/D and the P+ S/D by: epitaxial growth.

Another aspect of the present disclosure is a device including: a DNW region in a portion of a p-sub; a HVPDDD region in a portion of the DNW region; a first NW and a second NW in a portion of the DNW region, the second NW between the first NW and the HVPDDD region and laterally separated from the HVPDDD region; a PW in a portion of the HVPDDD region; an N+ implant in a portion of the first NW and a P+ implant in a portion of the PW; a first fin structure, a second fin structure and a third fin structure over the first NW, the second NW and the PW, respectively; and a N+ S/D, a P+ S/D and a P+ S/D over the first fin structure, the second fin structure and the third fin structure, respectively.

Aspects of the device include a GAA around each of the first fin structure, the second fin structure and the third fin structure; and a pair of dummy fins, laterally separated, over the DNW region between the second NW and the HVPDDD region. Another aspect includes a second P+ implant in a portion of the second NW; and a first contact structure, a second contact structure and a third contact structure over the N+ implant, the first P+ implant and the second P+ implant, respectively, wherein the N+ implant, the first P+ implant and the second P+ implant are a base, an emitter and a collector, respectively, and the first contact structure, the second contact structure and the third contact structure are a base contact, an emitter contact and a collector contact, respectively. Other aspects include a first contact structure and a second contact structure over the N+ implant and the P+ implant, respectively, wherein the N+ implant, the second fin structure and the P+ implant are a base, an emitter and a collector, respectively, and the first contact structure and the second contact structure are a base contact and a collector contact, respectively. A further aspect includes the GAA around the second fin structure and the third fin structure including an L-shaped portion facing each other. Additional aspects include a SBLK layer over the L-shaped portions and the P-sub in between. Another aspect includes a first contact structure and a second contact structure over the N+ implant and the P+ implant, respectively, wherein the N+ implant, the second fin structure and the P+ implant are a base, a collector and an emitter, respectively, and the first contact structure and the second contact structure are a base contact and an emitter contact, respectively. Other aspects include the first fin structure, the second fin structure and the third fin structure each being a plurality of fins. A further aspect includes the N+ S/D, the P+ S/D and the P+ S/D being epitaxial growth.

A further aspect of the present disclosure is a method including: forming a p-doped well (DPW) region in a portion of a n-type substrate (n-sub); forming a n-type high voltage double diffusion drain (HVNDDD) region in a portion of the DPW region; forming a first PW and a second PW in a portion of the DPW region, the second PW between the first PW and the HVNDDD region and laterally separated from the HVNDDD region; forming an NW in a portion of the HVNDDD region; forming a p-type (P+) implant in a portion of the first PW and an n-type (N+) implant in a portion of the NW; forming a first fin structure, a second fin structure and a third fin structure over the first PW, the second PW and the NW, respectively; and forming a P+ source/drain (S/D), an N+ S/D and an N+ S/D over the first fin structure, the second fin structure and the third fin structure, respectively.

Aspects of the present disclosure include forming a GAA around each of the first fin structure, the second fin structure and the third fin structure; and forming a pair of dummy fins, laterally separated, over the DPW region between the second PW and the HVNDDD region.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of known PNP/NPN-based ESD protection solutions with compromising limited device area attendant upon forming PNP/NPN-based ESD protection devices. The problem is solved, inter alia, by integrating a HV ESD PNP/NPN bipolar transistor in a VFET process.

Methodology in accordance with embodiments of the present disclosure includes forming a DNW region in a portion of a p-sub. A HVPDDD region is formed in a portion of the DNW region. A first NW and a second NW are formed in a portion of the DNW region, the second NW between the first NW and the HVPDDD region and laterally separated from the HVPDDD region. A PW is formed in a portion of the HVPDDD region. An N+ implant is formed in a portion of the first NW and a P+ implant is formed in a portion of the PW. A first fin structure, a second fin structure and a third fin structure are formed over the first NW, the second NW and the PW, respectively; and an N+ S/D, a P+ S/D and a P+ S/D are formed over the first fin structure, the second fin structure and the third fin structure, respectively.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
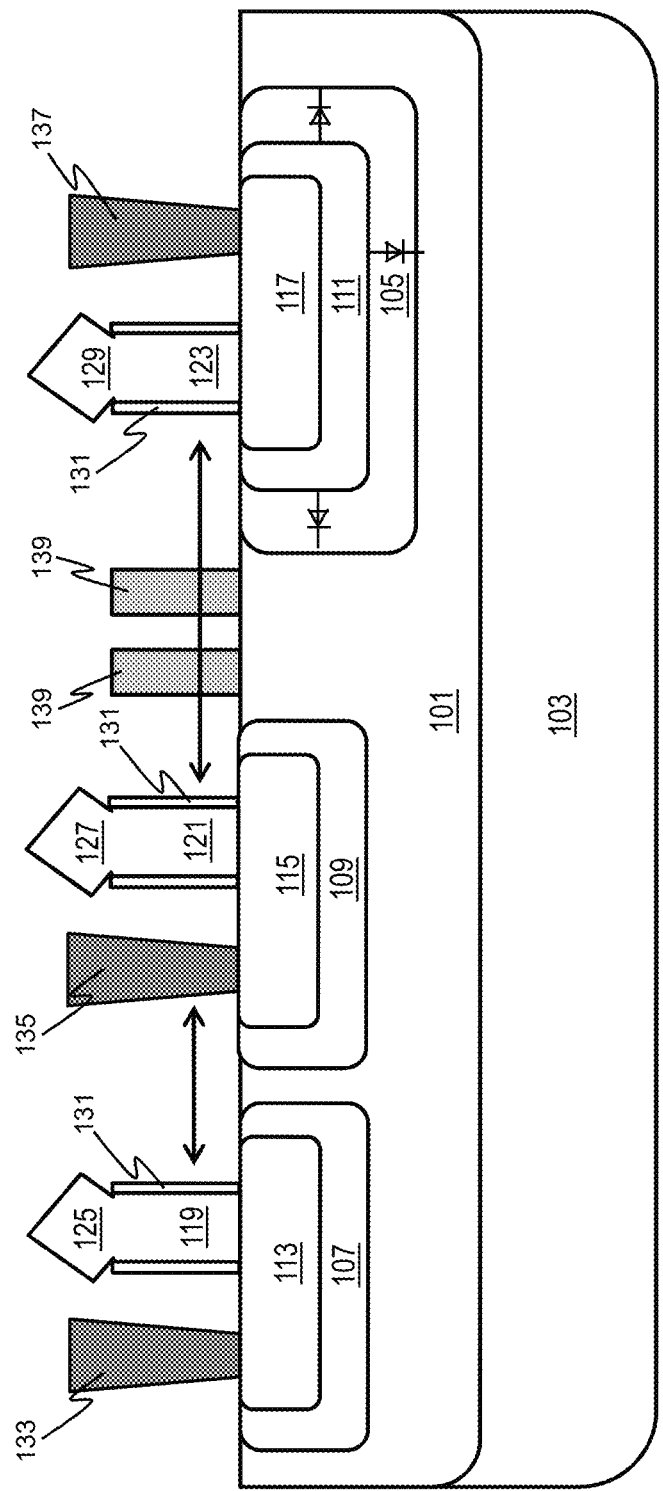
FIGS. 1 through 3 illustrates respective cross-sectional views of various integrated HV ESD PNP bipolar transistors and VFETs, in accordance with an exemplary embodiment.
Figure 2:
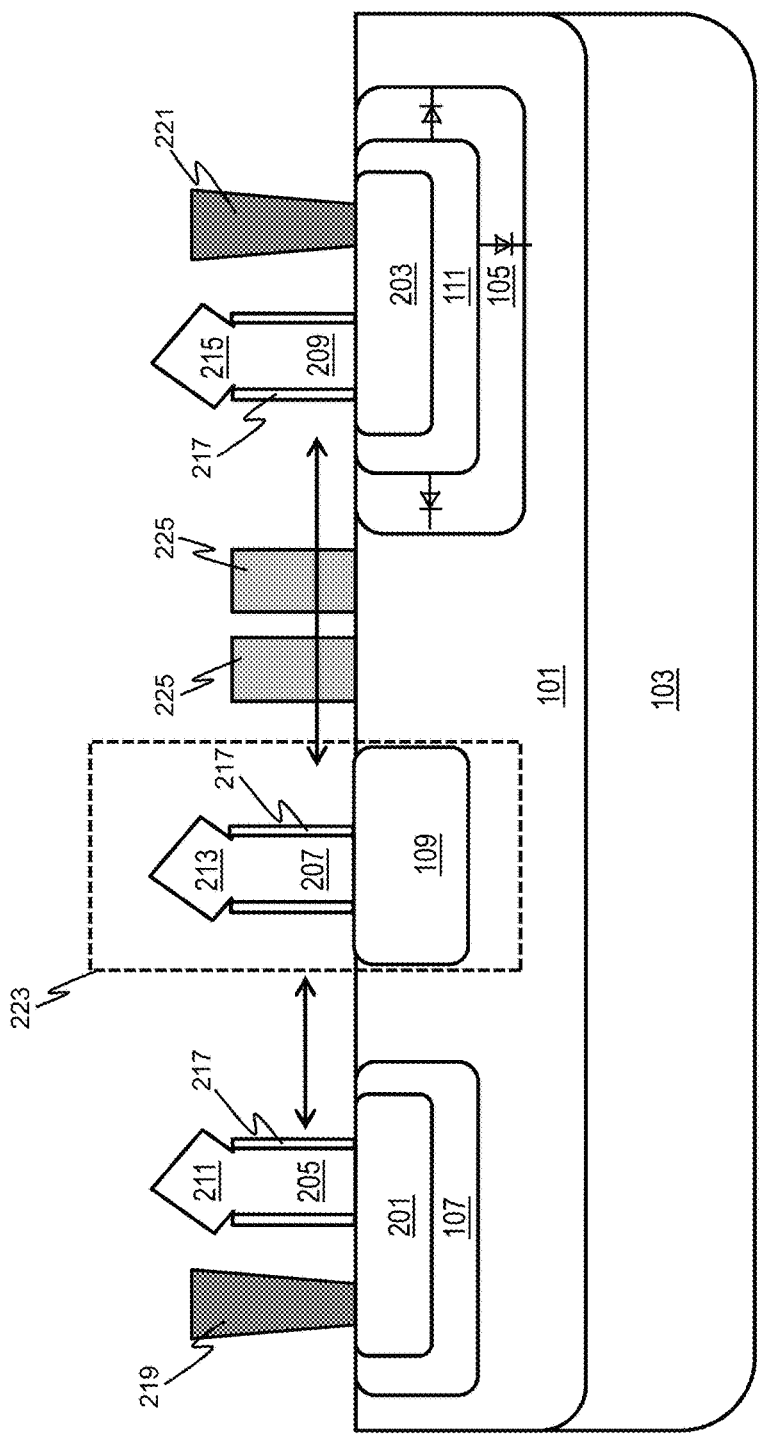
Figure 3:
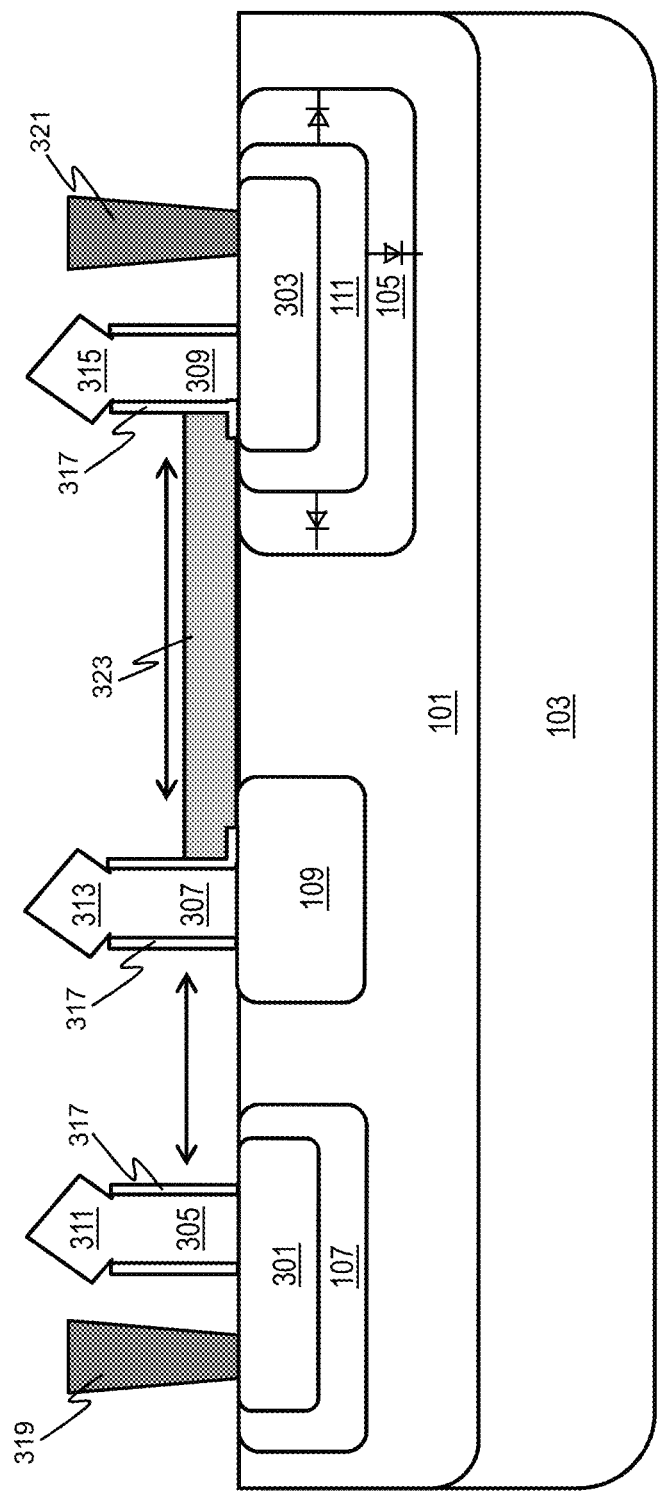

FIGS. 1 through 3 illustrates respective cross-sectional views of various integrated HV ESD PNP bipolar transistors and VFETs, in accordance with an exemplary embodiment. It is contemplated that FIGS. 1 through 3 can also be implemented in HV ESD NPN bipolar transistors depending on the resulting device requirement. Referring to FIG. 1, a DNW region 101 is formed in a portion of a p-sub 103. Next, a HVPDDD region 105 is formed in a portion of the DNW region 101. Then, NW 107 and 109 are formed in a portion of the DNW region 101. In this instance, the NW 109 is formed between the NW 107 and the HVPDDD region 105, and is laterally separated from the HVPDDD region 105. Subsequently, a PW 111 is formed in a portion of the HVPDDD region 105. Next, an N+ implant 113, a P+ implant 115 and a P+ implant 117 (bottom S/D) are formed in a portion of the NW 107, NW 109, and the PW 111, respectively. In this instance, the N+ implant 113, the P+ implant 115, and the P+ implant 117 are a base, a collector, and an emitter, respectively. Then, fin structures 119, 121 and 123 are formed over the NW 107, the NW 109 and the PW 111, respectively. It should be understood that the fin structures 119, 121 and/or 123 may each be formed as a single fin or they may each be composed of multiple fins.

Next, an N+ S/D 125 and P+ S/D 127 and 129 are formed, e.g., by epitaxial growth, over the fin structures 119, 121 and 123, respectively. The N+ S/D 125, and the P+ S/D 127 and 129 have contact to the N+ implant 113, the P+ implant 115 and P+ implant 117, respectively. Subsequently, a GAA 131 is formed around each of the fin structures 119, 121 and 123. Next, contact structures 133, 135, and 137 are formed, e.g., of tungsten (W), over the N+ implant 113, the P+ implant 115 and P+ implant 117, respectively. In this instance, the contact structures 133, 135, and 137 are a base contact structure, a collector contact structure, and an emitter contact structure, respectively. Then, a pair of dummy fins 139 is formed, laterally separated, over the DNW region 101 between the NW 109 and the HVPDDD region 105.

Referring to FIG. 2, similar to the process steps described with respect to FIG. 1 above, a DNW region 101 is formed in a portion of a p-sub 103. Next, a HVPDDD region 105 is formed in a portion of the DNW region 101. Then, NW 107 and 109 are formed in a portion of the DNW region 101. In this instance, the NW 109 is formed between the NW 107 and the HVPDDD region 105, and is laterally separated from the HVPDDD region 105. Subsequently, a PW 111 is formed in a portion of the HVPDDD region 105.

As illustrated in FIG. 2, an N+ implant 201, and a P+ implant 203 (bottom S/D) are formed in a portion of the NW 107 and PW 111, respectively. In this instance, the N+ implant 201 and the P+ implant 203 are a base and a collector. Then, fin structures 205, 207 and 209 are formed over the NW 107, the NW 109 and the PW 111, respectively. Again, it should be understood that the fin structures 205, 207 and/or 209 may each be formed as a single fin or they may each be composed of multiple fins. Next, an N+ S/D 211 and P+ S/D 213 and 215 are formed, e.g., by epitaxial growth, over the fin structures 205, 207 and 209, respectively. Subsequently, a GAA 217 is formed around each of the fin structures 205, 207 and 209. Next, contact structures 219 and 221 are formed, e.g., of W, over the NW 107 and the PW 111, respectively. In this instance, the contact structures are a base contact structure and a collector contact structure, respectively. Further, in this instance, an emitter contact is integrated within the fin structure 207 as highlighted by the box 223, thereby forming a junction between the P+ S/D 213 and the NW 109. Then, a pair of dummy fins 225 is formed, laterally separated, over the DNW region 101 between the NW 109 and the HVPDDD region 105.

Referring to FIG. 3, similar to the process steps described with respect to FIG. 2 above, a DNW region 101 is formed in a portion of a p-sub 103. Next, a HVPDDD region 105 is formed in a portion of the DNW region 101. Then, NW 107 and 109 are formed in a portion of the DNW region 101. In this instance, the NW 109 is formed between the NW 107 and the HVPDDD region 105, and is laterally separated from the HVPDDD region 105. Subsequently, a PW 111 is formed in a portion of the HVPDDD region 105.

As depicted in FIG. 3, an N+ implant 301 and a P+ implant 303 (bottom S/D) are formed in a portion of the NW 107 and PW 111, respectively. In this instance, the N+ implant 301 and the P+ implant 303 are a base and an emitter. Then, fin structures 305, 307 and 309 are formed over the NW 107, the NW 109 and the PW 111, respectively. Again, it should be understood that the fin structures 305, 307 and/or 309 may each be formed as a single fin or they may each be composed of multiple fins. Next, an N+ S/D 311 and P+ S/D 313 and 315 are formed, e.g., by epitaxial growth, over the fin structures 305, 307 and 309, respectively. Subsequently, a GAA 317 is formed around the fin structures 305, 307 and 309. In this instance, the GAA 317 between fin structures 307 and 309 have an L-shape facing each other. Next, contact structures 319 and 321 are formed, e.g., of W, over the NW 107 and the PW 111, respectively. In this instance, the contact structures 319 and 321 are a base contact structure and an emitter contact structure, respectively. Further, in this instance, a collector contact is integrated within the fin structures 307, thereby forming a junction between the P+ S/D 313 and the NW 109. Then, a SBLK layer 323 is formed, e.g., of nitride, over the L-shaped portions of the GAA 317 and the p-sub 103 in between.

Figure 4:
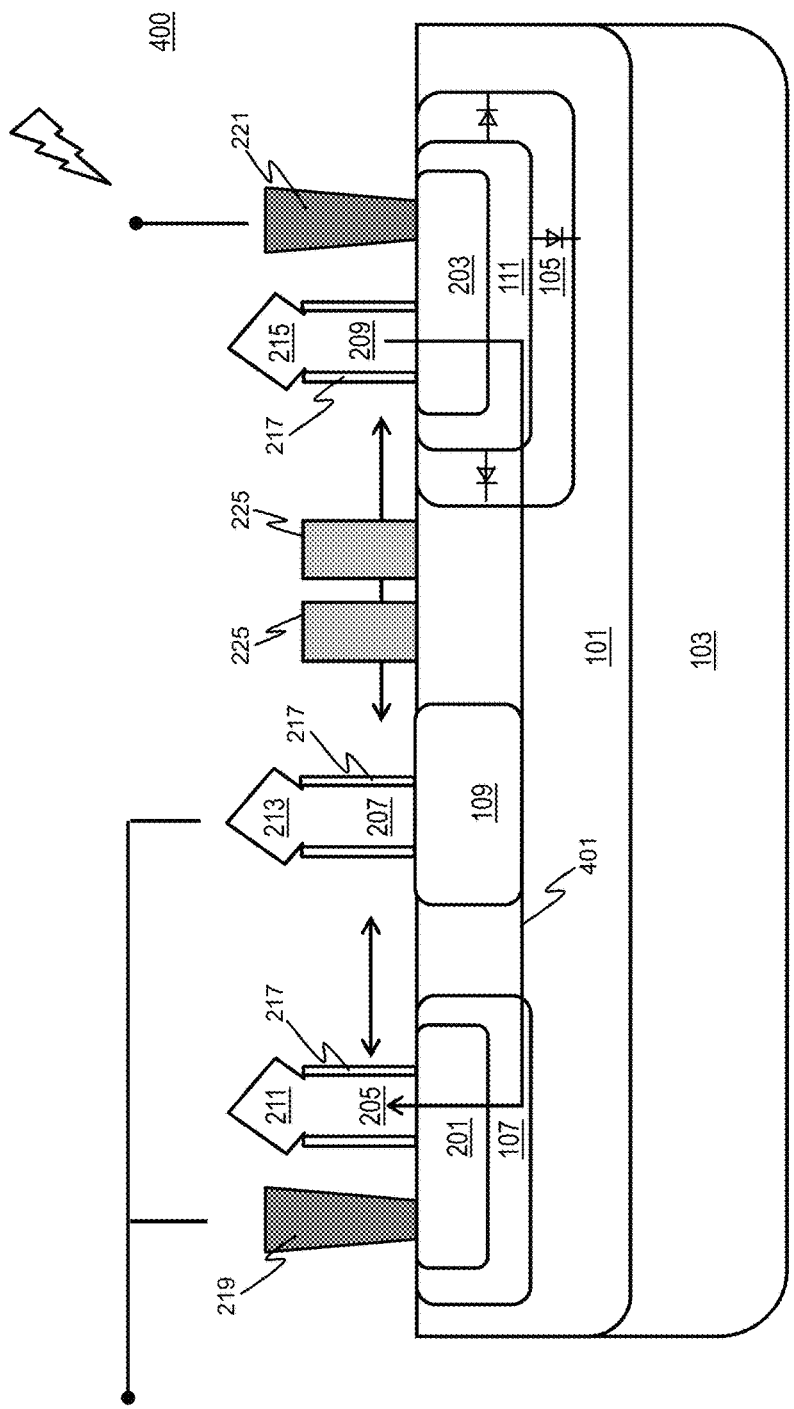
FIG. 4 illustrates an operation mode of a typical ESD protection device during a positive ESD stress, in accordance with an exemplary embodiment.

FIG. 4 illustrates an operation mode of a typical ESD protection device during a positive ESD stress, in accordance with an exemplary embodiment. In this instance, a 2 kilovolt (kV) human body model (HBM), which assumes a human body is a charged capacitor with 2000 volt voltage, and when one uses one's hand to touch the circuit accidentally, the circuit experiences a stress of 2 kV HBM. In this instance, when the P+ S/D 215, e.g., an emitter contact, experiences a positive ESD of 2 kV HBM, it acts as an input signal of the input stage. Since this ESD voltage may be sufficient to damage the ESD protection circuit 400, it must be clamped by the ESD protection elements. Hence, the P+ S/D 215 may forward bias (represented by line 401) the positive ESD of 2 kV HBM to the N+ S/D 211 through the P+ implant 203, the PW 111, the NW 109 and 107 and the N+ implant 201. The N+ S/D 211 then discharges the ESD current, thereby clamping the voltage below the breakdown voltage of the internal circuitry.

Figure 5:
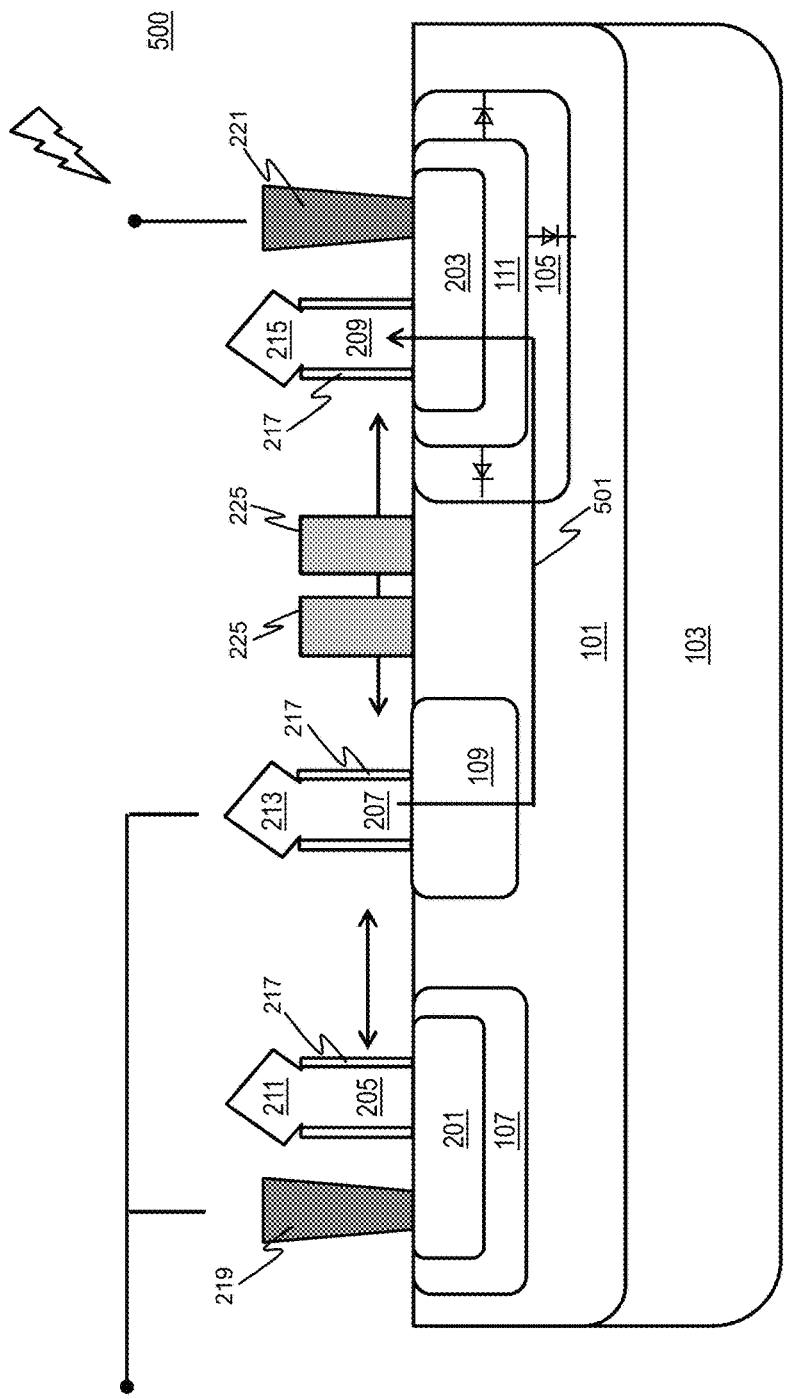
FIG. 5 illustrates an operation mode of a typical ESD protection device during a negative ESD stress, in accordance with an exemplary embodiment.

FIG. 5 illustrates an operation mode of a typical ESD protection device during a negative ESD stress, in accordance with an exemplary embodiment. In this instance, when the P+ S/D 215, e.g., an emitter contact, experiences an ESD of −2 kV HBM, the P+ S/D 213 may forward bias (represented by line 501) the negative ESD of −2 kV HBM to the P+ S/D 215 through the NW 109, the PW 111 and the P+ implant 203. As a result, the voltage on the P+ S/D 215 decreases until impact ionization bias the base of the PNP and triggers it. As illustrated, the ESD protection devices 400 and 500 have significant protection from both the negative and positive ESD stress.

The embodiments of the present disclosure can achieve several technical effects, such as the vertical fins contacting the planar bulk silicon (Si), a more compact structure relative to known devices as junctions are formed within the fins, and the compact structure utilizes the space more efficiently relative to known devices, thereby reducing the effective epitaxial (EPI) and silicide areas. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices including finFETs and VFETs.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming an n-doped well (DNW) region in a portion of a p-type substrate (p-sub);
forming a p-type high voltage double diffusion drain (HVPDDD) region in a portion of the DNW region;
forming a first n-well (NW) and a second NW in a portion of the DNW region, the second NW between the first NW and the HVPDDD region and laterally separated from the HVPDDD region;
forming a p-well (PW) in a portion of the HVPDDD region;
forming an n-type (N+) implant in a portion of the first NW and a p-type (P+) implant in a portion of the PW;
forming a first fin structure, a second fin structure and a third fin structure over the first NW, the second NW and the PW, respectively;
forming a N+ source/drain (S/D), a P+ S/D and a P+ S/D over the first fin structure, the second fin structure and the third fin structure, respectively; and
forming a gate all around (GAA) around each of the first fin structure, the second fin structure and the third fin structure.

2. The method according to claim 1, further comprising forming a pair of dummy fins, laterally separated, over the DNW region between the second NW and the HVPDDD region.

3. The method according to claim 2, further comprising:
forming a second P+ implant in a portion of the second NW; and
forming a first contact structure, a second contact structure and a third contact structure over the N+ implant, the first P+ implant and the second P+ implant, respectively,
wherein the N+ implant, the first P+ implant and the second P+ implant comprise a base, an emitter and a collector, respectively, and the first contact structure, the second contact structure and the third contact structure comprise a base contact, an emitter contact and a collector contact, respectively.

4. The method according to claim 2, further comprising:
forming a first contact structure and a second contact structure over the N+ implant and the P+ implant, respectively,
wherein the N+ implant, the second fin structure and the P+ implant comprise a base, an emitter and a collector, respectively, and the first contact structure and the second contact structure comprise a base contact and a collector contact, respectively.

5. The method according to claim 1, comprising forming the GAA around the second fin structure and the third fin structure with an L-shaped portion facing each other.

6. The method according to claim 5, further comprising forming a silicide block (SBLK) layer over the L-shaped portions and the P-sub in between.

7. The method according to claim 6, further comprising:
forming a first contact structure and a second contact structure over the N+ implant and the P+ implant, respectively,
wherein the N+ implant, the second fin structure and the P+ implant comprise a base, a collector and an emitter, respectively, and the first contact structure and the second contact structure comprise a base contact and an emitter contact, respectively.

8. The method according to claim 1, comprising forming the N+ S/D, the P+ S/D and the P+ S/D by:
epitaxial growth.

9. A device comprising:
an n-doped well (DNW) region in a portion of a p-type substrate (p-sub);
a p-type high voltage double diffusion drain (HVPDDD) region in a portion of the DNW region;
a first n-well (NW) and a second NW in a portion of the DNW region, the second NW between the first NW and the HVPDDD region and laterally separated from the HVPDDD region;
a p-well (PW) in a portion of the HVPDDD region;
an n-type (N+) implant in a portion of the first NW and a p-type (P+) implant in a portion of the PW;
a first fin structure, a second fin structure and a third fin structure over the first NW, the second NW and the PW, respectively; and
a N+ source/drain (S/D), a P+ S/D and a P+ S/D over the first fin structure, the second fin structure and the third fin structure, respectively,
wherein the first fin structure, the second fin structure and the third fin structure each comprise a plurality of fins.

10. The device according to claim 9, further comprising:
a gate all around (GAA) around each of the first fin structure, the second fin structure and the third fin structure; and
a pair of dummy fins, laterally separated, over the DNW region between the second NW and the HVPDDD region.

11. The device according to claim 10, further comprising:
a second P+ implant in a portion of the second NW; and
a first contact structure, a second contact structure and a third contact structure over the N+ implant, the first P+ implant and the second P+ implant, respectively,
wherein the N+ implant, the first P+ implant and the second P+ implant comprise a base, an emitter and a collector, respectively, and the first contact structure, the second contact structure and the third contact structure comprise a base contact, an emitter contact and a collector contact, respectively.

12. The device according to claim 11, further comprising:
a first contact structure and a second contact structure over the N+ implant and the P+ implant, respectively,
wherein the N+ implant, the second fin structure and the P+ implant comprise a base, an emitter and a collector, respectively, and the first contact structure and the second contact structure comprise a base contact and a collector contact, respectively.

13. The device according to claim 9, wherein the GAA around the second fin structure and the third fin structure comprise an L-shaped portion facing each other.

14. The device according to claim 13, further comprising a silicide block (SBLK) layer over the L-shaped portions and the P-sub in between.

15. The device according to claim 14, further comprising:
a first contact structure and a second contact structure over the N+ implant and the P+ implant, respectively,
wherein the N+ implant, the second fin structure and the P+ implant comprise a base, a collector and an emitter, respectively, and the first contact structure and the second contact structure comprise a base contact and an emitter contact, respectively.

16. The device according to claim 9, wherein the N+ S/D, the P+ S/D and the P+ S/D comprise epitaxial growth.

17. A method comprising:
forming a p-doped well (DPW) region in a portion of a n-type substrate (n-sub);
forming a n-type high voltage double diffusion drain (HVNDDD) region in a portion of the DPW region;
forming a first p-well (PW) and a second PW in a portion of the DPW region, the second PW between the first PW and the HVNDDD region and laterally separated from the HVNDDD region;
forming an n-well (NW) in a portion of the HVNDDD region;
forming a p-type (P+) implant in a portion of the first PW and an n-type (N+) implant in a portion of the NW;
forming a first fin structure, a second fin structure and a third fin structure over the first PW, the second PW and the NW, respectively; and
forming a P+ source/drain (S/D), an N+ S/D and an N+ S/D over the first fin structure, the second fin structure and the third fin structure, respectively.

18. The method according to claim 17, further comprising:
forming a gate all around (GAA) around each of the first fin structure, the second fin structure and the third fin structure; and
forming a pair of dummy fins, laterally separated, over the DPW region between the second PW and the HVNDDD region.

\* \* \* \* \*